United States Patent [19]

Barber et al.

[11] 4,085,382

[45] Apr. 18, 1978

[54] CLASS B AMPLIFIER

[75] Inventors: Herbert Douglas Barber, Dundas; Gary Curtis Salter, Burlington, both of Canada

[73] Assignee: Linear Technology Inc., Burlington, Canada

[21] Appl. No.: 743,883

[22] Filed: Nov. 22, 1976

[51] Int. Cl.² .............................................. H03F 3/26
[52] U.S. Cl. ..................................... 330/262; 330/252; 330/271; 330/291; 330/307
[58] Field of Search ....................... 330/15, 17, 19, 26, 330/28, 38 M; 357/51

[56] References Cited

U.S. PATENT DOCUMENTS

| | | | |
|---|---|---|---|
| 3,453,498 | 7/1969 | Hubner | 357/51 X |
| 3,487,324 | 12/1969 | Jones | 330/15 X |
| 3,547,716 | 12/1970 | Dewitt et al. | 357/51 X |
| 3,631,357 | 12/1971 | Hadley | 330/15 X |
| 3,723,896 | 12/1970 | Flickinger | 330/30 R |

*Primary Examiner*—Lawrence J. Dahl
*Attorney, Agent, or Firm*—Rogers, Bereskin & Parr

[57] ABSTRACT

A low level, low power, direct coupled integrated class B amplifier having a dual channel three stage preamplifier and a pair of output transistors, one for each channel. In each channel, a DC negative feedback loop connects the collector of the last stage preamplifier transistor to the base of the first stage preamplifier transistor to regulate the DC levels, and a resistive AC negative feedback loop connects the output transistor collector to the first preamplifier transistor collector to reduce the gain dependence of the channel on the current through the output transistor, thus enabling very low idle currents for the output transistors and also providing low distortion output. The resistor in each AC feedback loop is a floating tub resistor to enable it to be taken more than 0.6 volts above the battery voltage. Common mode rejection is provided for at least two of the three preamplifier transistors of each channel.

6 Claims, 5 Drawing Figures

CLASS B AMPLIFIER

This invention relates to an integrated circuit, low level, low power, direct coupled class B amplifier. More particularly, it relates to a class B amplifier of the kind above indicated, in which the idle current is reduced to a very low level while at the same time distortion is reduced to a low level. The amplifier is particularly suitable for use in hearing aids.

Class B amplifiers such as those used in hearing aids usually have a three stage direct coupled transistor preamplifier followed by transistor output stage. Distortion had long been a problem in these amplifiers. A major reason has been that the gain of a transistor increases with the current through it. Therefore, when an appropriate input signal is received by the amplifier, causing one of the output transistors to conduct more heavily, the gain of the output transistor increases. The increase in current and hence in gain can be by as much as a factor of 500. Unfortunately, the gain of the preceding transistor (namely the third stage preamplifier transistor) does not decrease as much as that of the output transistor increases (because of differences in the resistive loads connected to the various transistors in a direct coupled amplifier), and the net effect is that the overall gain of the amplifier increases with current. This results in a distorted wave form at the output. The conventional solution to this problem has been to bias the output transistors at a relatively high idle current, so that the changes in output transistor current and hence in gain with increased signal are reduced. Typical prior art class B amplifiers, such as those shown in Canadian Pat. Nos. 811,844 and 844,156, have an idle current of 200 microamperes for each of their two output transistors. When used in hearing aid or similar applications, in which a single very small battery cell is used, it would be desirable to have a lesser idle current, to increase the battery life.

A further difficulty with low level direct coupled class B hearing aid amplifiers is that their load is a hearing aid receiver, the impedance of which changes with frequency. In general, the impedance of the hearing aid receiver increases with frequency. The gain of the output transistor in prior art class B amplifiers increases approximately in direct proportion to load impedance, so the harmonics of the signal being amplifed receive greater amplification than the fundamental. This produces further distortion.

Accordingly, it is an object of the present invention to provide an integrated circuit, low level, low power, direct coupled class B amplifier in which the idle or stand-by current is reduced, and in which distortion is also reduced. To this end, the invention provides a two channel amplifier in which the collector of each output transistor is connected through a substantially purely resistive feedback loop to the collector of the corresponding first preamplifier transistor. This provides AC negative feedback which drastically reduces the distortion, enabling operation at an idle current typically of 50 microamperes with less distortion than many prior art class B amplifiers possess at idle currents of 500 microamperes. The resistive part of each AC feedback loop which is connected to the output transistor collector is electrically isolated from the battery voltage, to permit the output transistor collectors to swing more than .6 volts above the battery voltage. In addition, common mode rejection is provided by connecting the emitters of at least one pair (and preferably at least two pairs) of the preamplifier transistors together and through a resistor to ground.

Further objects and advantages will appear from the following description, taken together with the accompanying drawings, in which.

Figure 1:
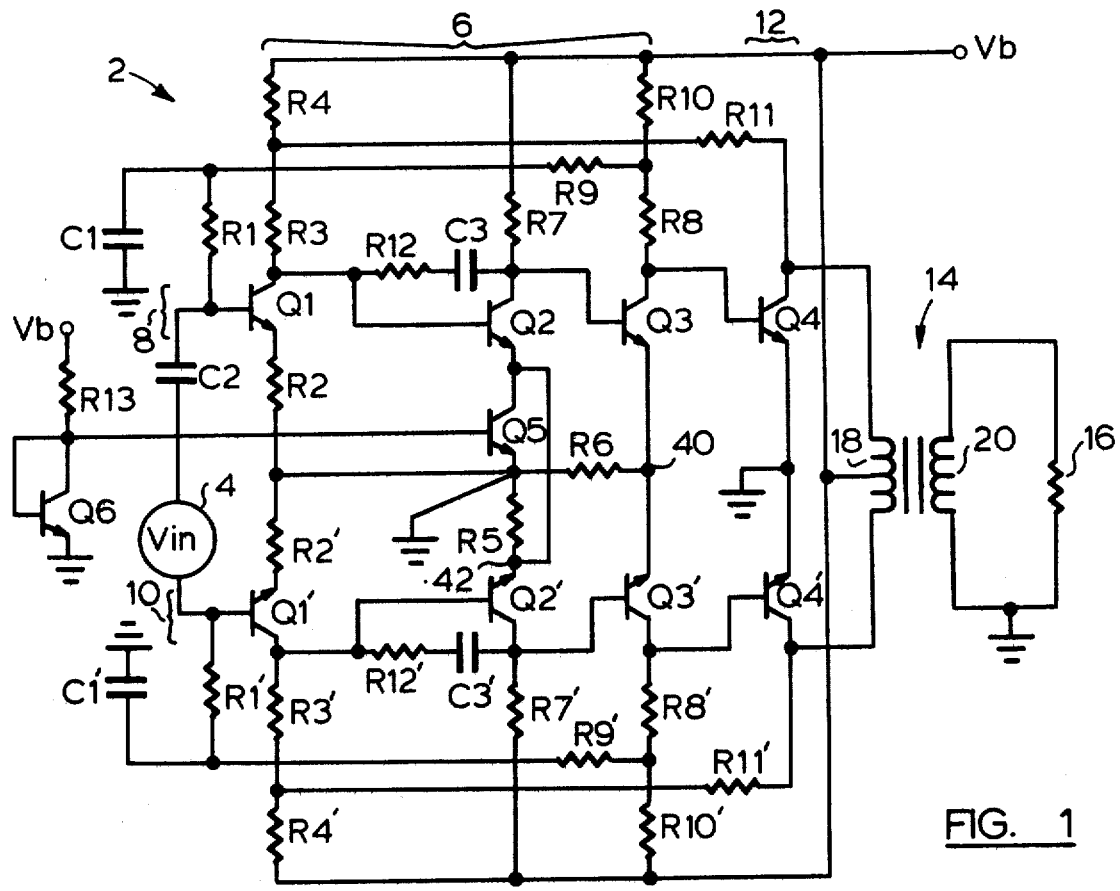
FIG. 1 is a schematic showing a first embodiment of the invention.

Reference is first made to FIG. 1, which shows an integrated circuit, low level, low power, direct coupled class B amplifier 2 having a source 4 of input signal $V_{in}$. The source 4 is typically a hearing aid magnetic microphone, which is connected in double-ended fashion. Alternatively, the source 4 may be a microphone having a single-ended output, combined with a phase splitter which transforms the single-ended microphone signal into a double-ended signal.

The amplifier 2 includes a dual channel preamplifier 6, having identical channels 8, 10. Each channel amplifies a single-ended half of the signal $V_{in}$. The signals from the preamplifier 6 are further amplified by an output stage 12 and are then combined in a transformer 14 and are fed to the load 16.

The preamplifier channel 8 and one-half of the output stage 12 will now be described in more detail. Since the second preamplifier channel 10 and the second half of the output stage 12 are identical to the first halves, the second halves will be referred to only briefly and are indicated by primed reference numerals.

Preamplifier channel 8 includes three stages, constituted by transistors $Q_1$, $Q_2$, $Q_3$, respectively, all shown as NPN transistors. (There will always be an odd number of preamplifier stages.) One end of the input signal source 4 is connected through capacitor C2 to the base of first stage transistor $Q_1$, while the emitter of transistor $Q_1$ is connected via resistor $R_2$ to ground. The collector of transistor $Q_1$ is connected through resistors R3 and R4 to the positive battery terminal Vb, and also to the base of second stage transistor Q2. The collector of transistor Q2 is connected through capacitor C3 and resistor R12 to the collector of transistor Q1 and is also connected through resistor R7 to the positive battery Vb and in addition is connected to the base of third stage transistor Q3. The emitter of transistor Q2 is connected to ground through a parallel circuit consisting of resistor R5, and the collector-emitter circuit of a transistor Q5.

The emitter of the third stage transistor Q3 is connected through resistor R6 to ground. The collector of transistor Q3 is connected through resistors R8 and R10 to the positive battery Vb, and is also connected to the base of transistor Q4, which forms one-half of the output stage. The emitter of transistor Q4 is connected to ground, while the collector of transistor Q4 is connected to one end of a centre tapped primary winding 18 of the transformer 14. (The centre tap is connected to the positive battery Vb.) The secondary winding 20 of transformer 14 is connected to the load 16.

As is conventional in a class B amplifier, when signal $V_{in}$ is applied differentially to the preamplifier inputs (the bases of transistors Q1, Q1'), each channel 8, 10 effectively amplifies a single-ended signal with a 180 degree phase difference between each channel. The amplified signals are then applied to the inputs of the output stage 12, i.e. to the bases of transistors Q4, Q4'. As a result, the output transistors Q4, Q4' are turned on and off in an alternate fashion, i.e. one of the output transistor Q4, Q4' conducts during one half of the input signal cycle while the other transistor is turned off, and vice versa during the other half cycle of the input signal. The half wave signals which appear at the output transistor Q4, Q4' collectors are then combined differentially by the transformer 14, which reconstructs complete sine waves across the load 16. An important characteristic of the class B output stage is its ability to deliver high signal power and yet idle at a very low quiescent current, which is an important feature for hearing aid applications.

In order to control the idle current of the output stage transistors Q4, Q4', a DC negative feedback circuit is conventionally provided to hold the base voltage of the output transistors Q4, Q4' constant. The DC feedback circuit consists of a resistive connection from the preamplifier output back to the base of the first preamplifier transistor. The resistive connection is from the junction of resistors R8, R10, through resistors R9 and R1 to the base of transistor Q1. AC signal is prevented from being fed back through this connection by decoupling with a capacitor C1, which short circuits to ground any AC signal which would otherwise be fed back to the base of transistor Q1 through resistor R1. The operation of this DC feedback is conventional and is fully explained in Canadian Pat. No. 844,156 to which reference may be made.

As previously indicated, a major disadvantage of prior art class B amplifiers, such as those shown in Canadian Pat. No. 844,156, is the distortion due to large signal conditions existing at the output. The reason for this is as follows. When transistor Q4 turns on, the current passing through this transistor increases from the DC idle current (which may be as low as 50 microamperes) to a peak current which may be as much as 25 milliamperes, i.e. a five hundred times increase in current. Since the gain of transistor Q4 is directly proportional to the current passing through it, the gain may therefore also increase by a factor of as much as five hundred.

The load seen by transistor Q3 is the parallel combination of transistor Q4 and resistors R8 and R10 (resistor R9 is very large and can to a first approximation be ignored). The input impedance presented by transistor Q4 is inversely proportional to the current through transistor Q4 and decreases by the same order of magnitude as the current increases, namely by as much as a factor of 500. However, because of the effect of resistors R8 and R10, the load on transistor Q3 will not decrease by a factor of 500, but will instead decrease by a substantially lesser amount. Specifically, if the impedance presented by transistor Q4 to transistor Q3 is $R_{inQ4}$, then the load on transistor Q3 namely $R_{L3}$, is:

$$R_{L3} = \frac{1}{\frac{1}{R8 + R10} + \frac{1}{R_{inQ4}}}$$

It will be seen that because of the effect of resistors R8, R10, the load on transistor Q3, namely $R_{L3}$, is not proportional to the input impedance $R_{inQ4}$ of transistor Q4. As the input impedance of transistor Q4 decreases (as the current through transistor Q4 increases), the load on transistor Q3 decreases by a lesser amount. Since the gain of transistor Q3 is to a first approximation directly proportional to the load on transistor Q3, therefore the gain of transistor Q3 does not decrease as much as that of transistor Q4 increases. This produces distortion, since large signals are amplified more than small signals. The result is a distorted wave form at load 16.

The distortion problem becomes more severe when the load which consists of transformer 14 and resistor 16, is replaced by a typical hearing aid output transducer (a receiver). Because the gain of the output stage transistors Q4, Q4' is approximately directly proportional to the load impedance, and because receivers have an impedance which increases with frequency, the harmonics which arise from distortion are amplified more than the fundamental. The distortion is therefore highlighted.

Typical prior art class B amplifiers have attempted to solve these problems by employing increased idle currents in their output stages (to reduce the factor by which the current changes in output transistors). Idle currents of 200 microamperes or more per output transistor are common. However, even with these relatively large idle currents, class B hearing aids with greater than ten percent acoustic distortion are common.

The invention employs a novel circuit which permits reduced idle currents in the output transistor stage (typically as low as 50 microamperes per output transistor) with less distortion than most prior art class B amplifiers possess at idle currents of 200 microamperes. In fact, a prototype hearing aid class B amplifier fabricated according to the invention possessed distortion of approximately two percent, which was approximately that possessed by typical prior art hearing aid class B amplifiers having idle currents of 500 microamperes.

An important feature of the invention is that it provides a novel AC negative feedback circuit, in which the collector of each output transistor Q4, Q4' is resistively coupled, through resistors R11 and R3, and R11' and R3', to the collector circuit of the first stage transistors Q1, Q1' respectively. It is found that this linearizes the gain of the amplifier, reducing the distortion due to output dependent non-linearity. A result of this feedback is that gain becomes more independent of load impedance, reducing the distortion highlighting occurring when a frequency dependent load such as a receiver is used. It is found that when the open loop gain of the stages Q2, Q3, Q4, multiplied by the ratio of the values of the resistors R11/R4, is much greater than one, then the gain of the combined circuit (preamplifier and output stage) is much less dependent on the output stage current. (As indicated in Table I at the end of this description, resistor R4 is a small value resistor as compared with resistors R11 and R3.) As previously indicated, it is found that an idle current of about 50 microamperes per output transistor will result in distortion of about two percent, which has been found to be acceptable.

The AC feedback loop through resistor R11 is not connected to the base of transistor Q1 because this would interfere with the DC feedback loop previously described and would also lower the input impedance of the transistor Q1 stage. A lowered input impedance for the transistor Q1 stage is undesirable in hearing aid applications because it reduces gain and makes tone control difficult. In addition, a connection through resistor R11 to the first preamplifier stage would have to be to the base of transistor Q1' (this is known as cross-coupling) to provide negative feedback. If the transducer fails to function as a good transformer, the AC feedback loop will be poorly defined, resulting in unpredictable gain for the circuit and possibly also in increased distortion.

In order to stabilize the amplifier with the two feedback circuits, compensation in the form of resistor R12 and capacitor C3 is provided. These components introduce a pole and a zero in locations which greatly improve the stability of the amplifier.

Figure 2:
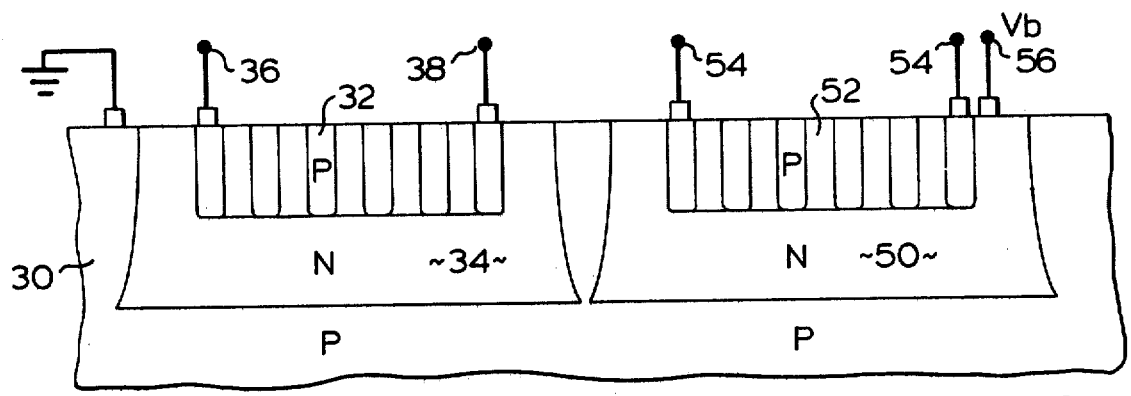
FIG. 2 is a cross-sectional view showing the electrical isolation of an AC feedback resistor from the battery voltage.

The amplifier shown is fabricated as an integrated circuit, typically (for the transistor types shown) on a P-type substrate. In such circuits, integrated resistors are normally fabricated as a diffused P-type layer residing in an epitaxial N-type region or tub. The epitaxial region is normally biased at the DC supply voltage to prevent the diffused layer to tub diode from conducting. However, with the circuit of the present invention, the voltage at the collectors of the output transistors Q4, Q4' under some operating conditions may swing above and below the battery voltage, due to the transformer action. When the diffused layer potential is taken .6 volts above the DC supply, the diffused layer to tub diode of resistors R11, R11' will conduct and short the output. To prevent this, an unconventional arrangement may be used in fabricating resistors R11 and R11'. The arrangement is shown in FIG. 2, in which the P-type substrate on which the circuit is formed is indicated at 30 and is shown as being grounded (which is conventional), and resistor R11 is shown as being fabricated of P-type material 32 residing in an epitaxial N-type region or tub 34. The contacts for resistor R11 are indicated at 36, 38. It will be seen that no contacts are provided for the tub 34; instead the tub 34 is left to float. In this manner, even when a contact of resistor R11 is taken above or below the battery voltage, the diode formed by P-type material 32 and N-type region 34 will not conduct and short the output. The resistors R11, R11' may be isolated in other ways, such as by use of thick or thin film deposition techniques, or by use of discrete external resistors.

It will be noted that although resistors R11, R11' are isolated from the battery voltage, from the substrate 30, and from each other (they are located in separate floating tubs 34), the remaining resistors of the amplifier 2 may if desired all be located in a single tub biased at the battery voltage. This is indicated in FIG. 2, which shows a further tub 50 containing a resistor 52 having contacts 54. Resistor 52 may be any of the resistor of FIG. 1 except for resistors R11, R11'. All of the resistors of FIG. 1 may be located in the same tub 50 except for resistors R11, R11'. Tub 50 is biased at the battery voltage $V_b$ via contact 56 which is connected to the battery.

Figure 2A:
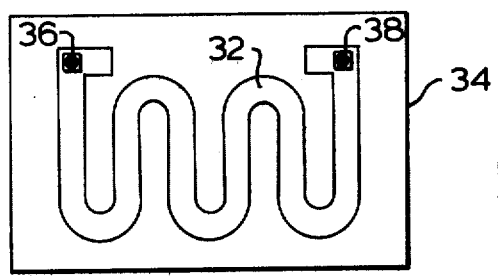
FIG. 2A is a plan view showing a floating tub resistor used in the FIG. 1 embodiment.

It is normally desirable to bias at the battery voltage the tubs in which resistors are located, to supply the reverse bias leakage current between the tub 50 and substrate 30, so that this current need not be supplied from the resistor in the tub. If the leakage current were supplied from the tub resistor, this could result in PNP transistor action; causing excessive current to flow from the resistor to the substrate. However, where the resistor voltage can rise more than .6 volts above the battery voltage (as in the case of resistors R11, R11'), this undesired transistor action becomes a certainty. Therefore the tubs for resistors R11, R11' have been isolated from the battery, and the current gain of any undesired transistor action has been made as small as possible by making the tub 34 as small as possible. As shown in FIG. 2A, the boundaries of the tub 34 are located in close proximity to the material 32 which constitutes resistor R11. In other words, the area of the junction between tub 34 and substrate 30 is made as small as possible.

A further feature of the amplifier of the invention is that it includes common mode rejection. Common mode rejection is particularly important in a hearing aid, because typical hearing aid batteries have an output impedance of between two and fifteen ohms. This may cause a signal to appear on the battery line which can be of magnitude comparable to the signal being amplified. The battery line signal can easily find its way into the conventional signal path via the preamplifier collector circuits, resulting in instability or distortion. Since the battery line signal is equal or common to both channels, whereas the applied signal is 180° out of phase in each channel, it is important that the amplifier be able to distinguish between common and difference signals, and to give the common signal less gain than it would the difference signal. The common mode rejection or CMR is measurable by the ratio of the difference gain to the common gain.

Common mode rejection or CMR is provided in the third preamplifier stage of the FIG. 1 circuit by connecting the emitters of transistors Q3, Q3' together at node 40 and connecting node 40 to ground through resistor R6. With this arrangement, if identical positive-going signals appear at the bases of transistors Q3, Q3', this will tend to turn the transistors on harder, and will also tend to drive their emitters positive. The net result is that there is little or no change in the base-emitter voltage of transistors Q3, Q3' (to a first order approximation) and therefore the common mode signals receive little or no amplification. However, if difference mode signals appear at the bases of transistors Q3, Q3', for example if a positive-going signal appears at the base of transistor Q3 and a corresponding negative-going signal appears at the base of transistor Q3', then the net change in potential at the node 40 is very small (since the positive-going change contributed by the emitter of transistor Q3 is cancelled by the negative-going change contributed by the emitter of transistor Q3'). Hence the change in the base-emitter voltage of transistor Q3 is large, resulting in amplification of the positive going signal at the base of transistor Q3. The result is that common mode signals are amplified substantially less than difference mode signals, i.e. the stage possesses common mode rejection.

In contrast, the transistor Q1, Q1' stage does not possess CMR, since although resistors R2, R2' will reduce the gain given to common mode signals, they will equally reduce the gain given to difference mode signals.

The second preamplifier stage, consisting of transistors Q2 and Q2' is provided with CMR through transistor Q5 and resistor R5. Specifically, the emitters of transistors Q2, Q2' are connected together to node 42 and are then connected to ground through resistor R5. The collector-emitter circuit of transistor Q5 is connected in parallel with resistor R5. Transistor Q5 is biased to operated as a current source, by means of diode connected transistor Q6, which is connected to the base of transistor Q5 as shown. The transistor Q6 collector is connected through resistor R13 to the positive supply Vb, and the current through transistor Q6 sets the current through transistor Q5.

Ideally, optimum CMR would be provided by eliminating resistor R5 and simply providing transistor Q5 to connect node 42 to ground (since the current source constituted by transistor Q5 theoretically has infinite impedance). However, if the node 42 were connected to ground only through the current source constituted by transistor Q5, then the voltage at node 42 would be unconstrained and could be at any potential, as determined by the current source. This would destroy the DC gain provided by the second stage transistors Q2, Q2′ and would also destroy the regulating action provided by the DC feedback loop through resistors R9 and R1. Therefore, a finite resistance connection from node 42 to ground is required to constrain the voltage at the emitters of transistors Q2, Q2′, and for this reason resistor R5 is provided connected in parallel with transistor Q5.

It should be noted that small resistances may be inserted for example between the emitters of Q3, Q3′ and node 40 and between the emitters of transistors Q2, Q2′ and node 42, without seriously reducing the CMR of those stages.

Figure 3:
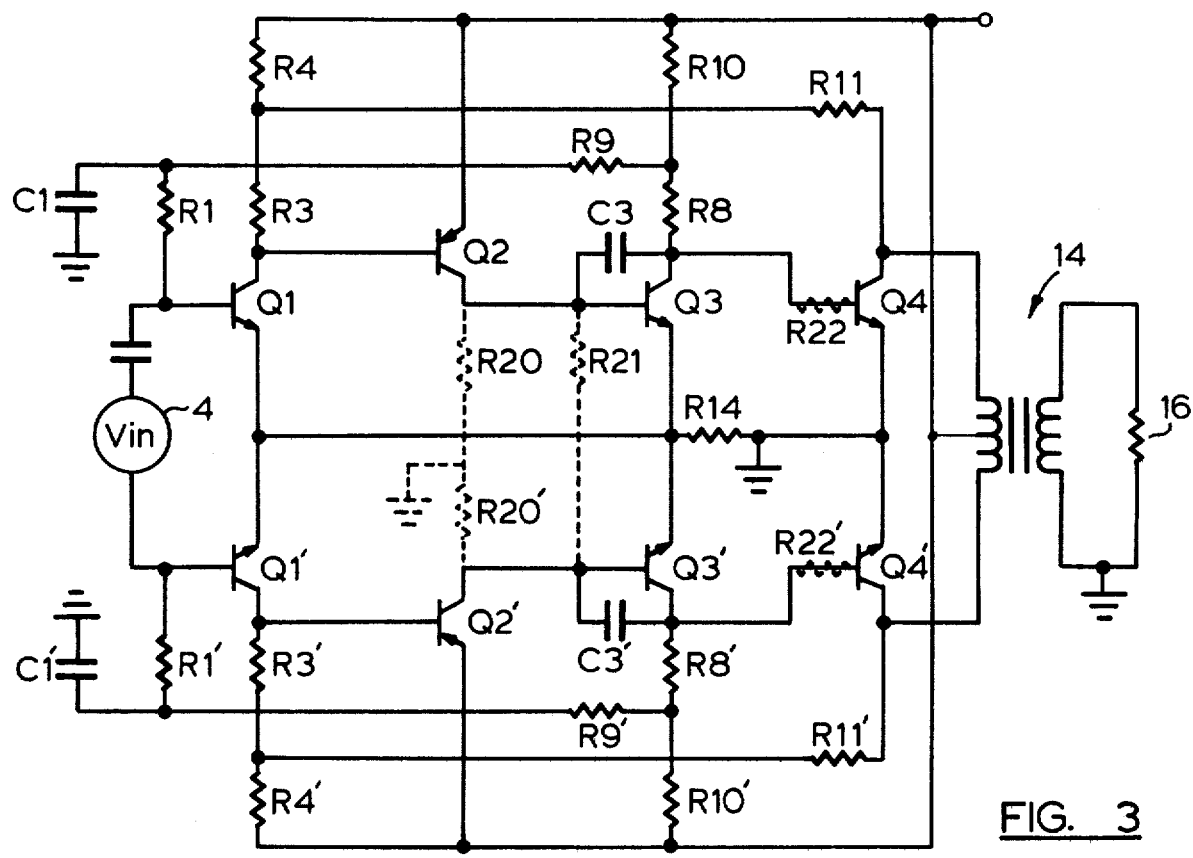
FIG. 3 is a schematic showing a second embodiment of the invention.

Reference is next made to FIG. 3, which shows a circuit closely resembling that of FIG. 1. In FIG. 3, corresponding references have been used to indicate parts corresponding to those of FIG. 1.

The FIG. 3 circuit is designed for less gain than the FIG. 1 circuit, and accordingly, transistors Q2, Q2′ of FIG. 3 have been made PNP transistors. Since the currents flowing in the emitter-collector circuits of transistors Q2, Q2′ are effectively the base currents of transistors Q3, Q3′, the power requirements and the gain of the FIG. 3 circuit are both reduced from those of the FIG. 1 circuit. Common mode rejection is provided in the FIG. 3 circuit by connecting the emitters of transistors Q3, Q3′ together and connecting them to ground through resistor R14, and by similarly connecting the emitters of transistors Q1, Q1′ together and connecting them through resistor R14 to ground.

It is found in the FIG. 3 circuit that capacitors C3, C3′ require substantial charging current in order to follow the signal. Under some conditions the collector current of transistor Q2 is too small to provide adequate charging current, resulting in distortion. Accordingly, and as indicated in dotted lines, R20, R20′ may be provided to connect the collectors of transistors Q2, Q2′ to ground, thereby increasing the currents in the Q2, Q2′ stage. Resistor R21 may be provided to connect the collectors of transistors Q2, Q2′ together, thereby compensating the gain increase which results from the increased collector currents of Q2, Q2′ caused by the addition of resistors R20, R20′.

In addition, and if desired, additional resistors R22, R22′ may be provided, as indicated in dotted lines, between the collectors of transistors Q3, Q3′ and the bases of transistors Q4, Q4′ respectively, to further linearize the operation of transistor Q4 (by reducing the variability with current of the input impedance of transistors Q4, Q4′).

Apart from these changes, the FIG. 3 circuit is essentially identical with the FIG. 1 circuit.

Figure 4:
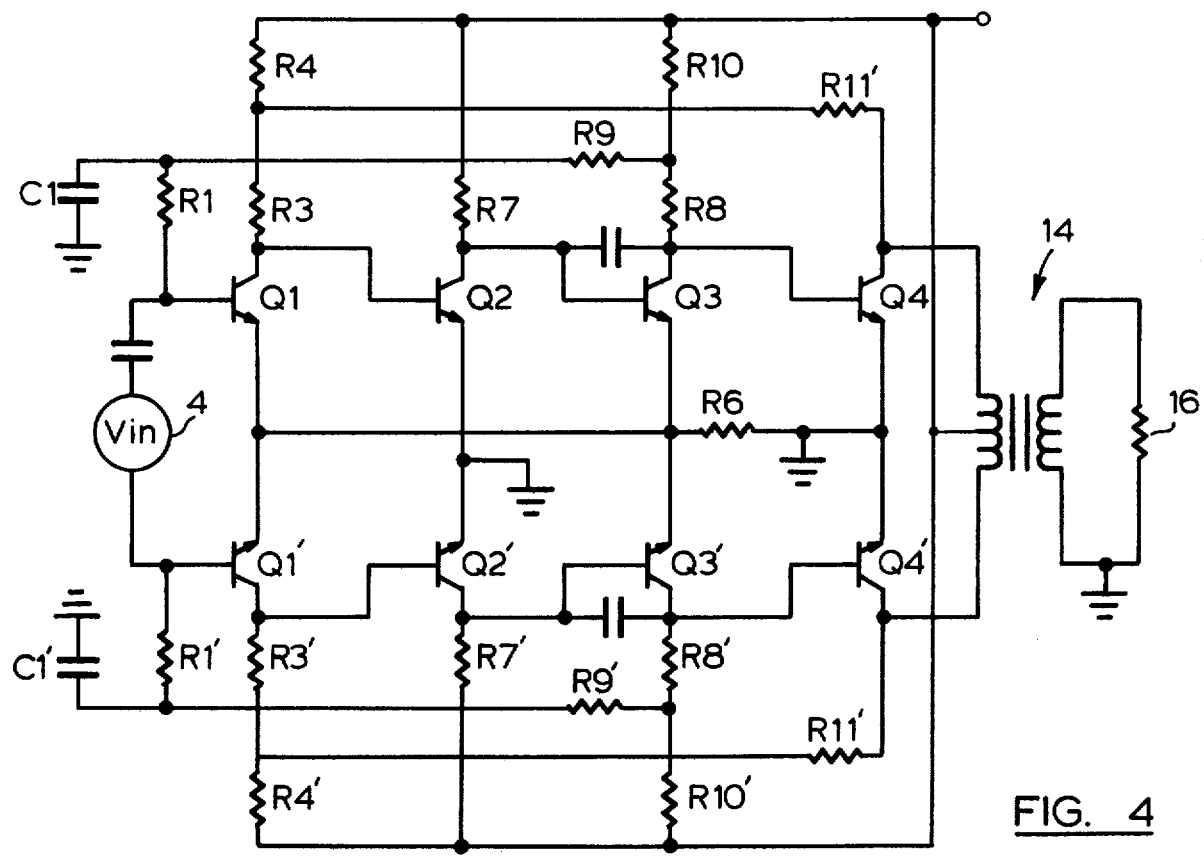
FIG. 4 is a schematic showing a third embodiment of the invention.

Reference is next made to FIG. 4 which shows a circuit which is again almost identical with that of FIG. 1, and again corresponding reference numerals indicate parts corresponding to those of FIG. 1. The difference between the FIG. 4 circuit and the FIG. 1 circuit are that in the FIG. 4 circuit, transistor Q5 and resistor R5 have been deleted, removing the CMR for the second stage of the preamplifier. Instead, CMR has been provided for the first stage by connecting the emitters of transistors Q1, Q1′ together and through resistor R6 to ground. In addition, compensation resistor R12 has been deleted.

Typical values for the components shown in FIG. 1 are given in Table I below.

Table I

| COMPONENT | TYPICAL VALUE |
|---|---|
| $R_1, R_1'$ | 27 Kohms |
| $R_2, R_2'$ | 2.3 Kohms |
| $R_3, R_3'$ | 52 Kohms |
| $R_4, R_4'$ | 120 ohms |
| $R_5$ | 10 Kohms |
| $R_6, R_6'$ | 1.5 Kohms |
| $R_7, R_7'$ | 24 Kohms |
| $R_8, R_8'$ | 400 ohms |
| $R_9, R_9'$ | 47 Kohms |
| $R_{10}, R_{10}'$ | 9.1 Kohms |
| $R_{11}, R_{11}'$ | 15 Kohms |
| $R_{12}, R_{12}'$ | 8.2 Kohms |
| $R_{13}$ | 36 Kohms |
| Load Resistor 16 | 1 Kohms |
| $C_1, C_1'$ | 10µf |
| $C_2$ | .03µf |
| $C_3, C_3'$ | 100 pf |
| $V_b$ | 1.55 volts |
| $Q_1, Q_1', Q_2, Q_2', Q_3 Q_3'$ | npn transistors with an emitter area multiple of 1 |
| $Q_5, Q_6$ | npn transistors with an emitter area multiple of 3 |
| $Q_4, Q_4'$ | |
| Transformer 14 | centre tapped primary 1:1 turns ratio |

What we claim is:

1. An integrated circuit low level low power direct coupled class B amplifier formed on a substrate and having a terminal adapted to be connected to a battery, said amplifier comprising:
   (a) two substantially identical amplifying channels,
   (b) each amplifying channel having, separately from the other channel:
      (i) a preamplifier channel having three preamplifier gain transistors including a first stage preamplifier transistor a second stage preamplifier transistor and a third stage preamplifier transistor, all of said preamplifier transistors being direct coupled,
      (ii) an output transistor direct coupled to said third stage preamplifier transistor,
      (iii) a DC negative feedback loop connecting the collector of said third stage preamplifier transistor to the base of said first stage preamplifier transistor to regulate the DC currents in said output transistors,
      (iv) the collector of said first stage preamplifier transistor being connected to one end of a first resistance, the other end of said first resistance being connected at a junction to one end of a second resistance, the other end of said second resistance being connected to said battery terminal, said first resistance being of substantially higher resistance than said second resistance,
      (v) a substantially purely resistive AC negative feedback loop for reducing the dependence of the gain of each channel on the current through said output transistors, said feedback loop comprising a feedback resistor having a body and a pair of resistor terminals, one of said resistor terminals being connected to the collector of said output transistor and the other of said resistor terminals being coupled to said junction, the resistance of said feedback resistor being substantially higher than that of said second resistance, (vi) the body of said feedback resistor being insulated from said battery terminal so that the voltage at said feedback resistor may swing above the voltage of said battery, (vii) compensation means, including a capacitor, connected to the base of one of said preamplifier transistors other than said first preamplifier transistor, (c) the emitters of at least one pair of said preamplifier transistors being coupled together and through resistance means to ground to provide common mode rejection for said preamplifier, (d) a load for said output transistors, said load having a centre tap and a pair of load end terminals, (e) said output transistors being of the same polarity and the emitters of said output transistors being coupled together, the collector of one output transistor being connected to one load end terminal and the collector of the other output transistor being connected to the other load end terminal.

2. An amplifier according to claim 1 wherein the emitters of a second pair of said preamplifier transistors are coupled together and through resistance means to ground, to provide common mode rejection for two stages of said preamplifier.

3. An amplifier according to claim 2 wherein said emitters of the third stage preamplifier transistors are coupled together and through a third resistor to ground, and wherein the emitters of the second preamplifier stage transistors are coupled together and through a fourth resistor to ground, and further including current source means coupled in parallel with said fourth resistor, said current source means comprising the collector-emitter circuit of a further transistor.

4. An amplifier according to claim 2 wherein the emitters of the first and third stage preamplifiers are all coupled together and through a common resistor to ground.

5. An amplifier according to claim 2 wherein each said feedback resistor is of the same conductivity type material as said substrate and said body thereof is electrically insulated from said substrate by a tub of opposite conductivity type material, said tub being free of direct connection to said battery terminal.

6. An amplifier according to claim 5 wherein said amplifier, and the boundaries of said tub are in close proximity to those of said feedback resistor.

* * * * *